US008946652B2

(12) United States Patent
Takahashi et al.

(10) Patent No.: US 8,946,652 B2
(45) Date of Patent: Feb. 3, 2015

(54) SAMPLE POSITIONING APPARATUS, SAMPLE STAGE, AND CHARGED PARTICLE BEAM APPARATUS

(71) Applicant: Hitachi High-Technologies Corporation, Tokyo (JP)

(72) Inventors: Motohiro Takahashi, Tokyo (JP); Hironori Ogawa, Tokyo (JP); Nobuo Shibata, Tokyo (JP); Masaki Mizuochi, Tokyo (JP); Shuichi Nakagawa, Tokyo (JP); Hiroshi Tsuji, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/356,566

(22) PCT Filed: Nov. 8, 2012

(86) PCT No.: PCT/JP2012/078948
§ 371 (c)(1),
(2) Date: May 6, 2014

(87) PCT Pub. No.: WO2013/069722
PCT Pub. Date: May 16, 2013

(65) Prior Publication Data
US 2014/0312246 A1    Oct. 23, 2014

(30) Foreign Application Priority Data

Nov. 9, 2011 (JP) .................................. 2011-245064

(51) Int. Cl.
*H01J 37/20* (2006.01)
(52) U.S. Cl.
CPC ..................................... *H01J 37/20* (2013.01)

USPC ...... 250/442.11; 318/560; 318/362; 318/375; 318/592

(58) Field of Classification Search
USPC .............. 250/442.11; 318/560, 592, 362, 375
See application file for complete search history.

(56) References Cited

U.S. PATENT DOCUMENTS

| 7,791,043 | B2 * | 9/2010 | Seya et al. ................ 250/442.11 |
| 2008/0211349 | A1 * | 9/2008 | Seya et al. ................ 310/323.02 |
| 2009/0218510 | A1 * | 9/2009 | Fujita ......................... 250/443.1 |
| 2009/0236540 | A1 * | 9/2009 | Seya et al. ................ 250/442.11 |
| 2009/0250625 | A1 * | 10/2009 | Koyama et al. ........... 250/442.11 |
| 2009/0251091 | A1 * | 10/2009 | Fujita et al. ................... 318/594 |

FOREIGN PATENT DOCUMENTS

| JP | 2007324045 A | * 12/2007 | .............. H01J 37/20 |
| JP | 2009-224234 A | 10/2009 | |
| JP | 2011-013825 A | 1/2011 | |

* cited by examiner

*Primary Examiner* — Michael Logie
(74) *Attorney, Agent, or Firm* — McDermott Will & Emery LLP

(57) ABSTRACT

Provided is a sample positioning technology wherein microvibrations of a top table on which a sample is placed are suppressed such that the quality of an image to be observed or the precision of a measured dimension value can be improved. A sample positioning apparatus according to the present invention is provided with an active brake for stopping the top table, an inner frame which surrounds the active brake, an outer frame which surrounds the inner frame, and actuators for driving the active brake. The actuators, after driving the active brake to stop the top table with respect to a stage, press the outer frame to adjust the position of the top table.

11 Claims, 10 Drawing Sheets (a)

(b)

(c)

SAMPLE POSITIONING APPARATUS, SAMPLE STAGE, AND CHARGED PARTICLE BEAM APPARATUS

RELATED APPLICATIONS

This application is the U.S. National Phase under 35 U.S.C. §371 of International Application No. PCT/JP2012/078948, filed on Nov. 8, 2012, which in turn claims the benefit of Japanese Application No. 2011-245064, filed on Nov. 9, 2011, the disclosures of which Applications are incorporated by reference herein.

TECHNICAL FIELD

The present invention relates to a technique for positioning target samples.

BACKGROUND ART

Along with miniaturization of semiconductor elements in recent years, manufacturing apparatuses as well as detection apparatuses or evaluation apparatuses are required to achieve high-precision according to the miniaturization. For example, in order to evaluate whether shape and size of patterns formed on semiconductor wafers are correct, Scanning Electron Microscope with length measurement function (hereinafter, referred to as length measurement SEM) is used for that purpose. Length measurement SEM is one of charged particle apparatuses that irradiate electrons onto a sample to measure the length of the sample.

When evaluating samples using length measurement SEM, positioning precision of the sample stage has a significant effect on measurement precision such as resolution or pattern dimension. Specifically, even when the sample stage is not moving at a predetermined position for sample observation, nanometer-scale vibration of the stage may degrade image quality of the observed image.

Patent Literature 1 listed below uses an ultrasound motor using two piezoelectric actuators diagonally extending with respect to the moving direction of the stage. Patent Literature 1 achieves both of normal quick movement and nanometer-scale movement by providing a phase difference between applied voltages of the two piezoelectric actuators.

Patent Literature 2 listed below controls, using two active brakes with symmetrical shapes, applied voltages of a piezoelectric actuator that drives a brake, thereby suppressing position offsets of the stage due to the contact between the brake pad and the stage.

CITATION LIST

Patent Literature

Patent Literature 1: JP Patent Publication (Kokai) No. 2009-224234 A
Patent Literature 2: JP Patent Publication (Kokai) No. 2011-013825 A

SUMMARY OF INVENTION

Technical Problem

As observed patterns, foreign objects, or defects become smaller, the imaging magnification has to be improved. Thus it is important to improve the positioning precision of the stage that positions samples. Then it could be advantageous to equip, at the top table portion on which samples are placed, a micro-scale moving mechanism with positioning precision higher than that of the stage, thereby improving the positioning precision.

Conventional micro-scale moving mechanisms significantly degrade the observed image because of the nanometer-scale vibration generated from the linear motor. In order to remove the nanometer-scale vibration from the linear motor, it is necessary to stop the output of the linear motor. However, if the output of the linear motor is stopped, drift of the table cannot be compensated. In order to compensate drifts, active brakes with no friction are effective. On the other hand, when the active brake works, disturbance is induced to the table. Thus positioning errors may still remain if active brakes only are used.

The present invention is made in terms of the circumstance described above, and an objective of the present invention is to provide a sample positioning technique that can suppress nanometer-scale vibrations of the top table on which samples are placed to improve image quality of the observed image or to improve precision of measured size.

Solution to Problem

The sample positioning apparatus according to the present invention comprises an active brake that stops a top table, an inner frame that surrounds the active brake, an outer frame that surrounds the inner frame, and an actuator that drives the active brake. The actuator drives the active brake to stop the top table with respect to a stage, and then presses the outer frame to adjust a position of the top table.

Advantageous Effects of Invention

With the sample positioning apparatus according to the present invention, the drift of the top table on which samples are placed is suppressed and nanometer-scale vibrations thereof are suppressed, thereby providing a sample positioning apparatus that can improve image quality of the observed image or precision of measured sizes.

DESCRIPTION OF EMBODIMENTS

Embodiment 1

Figure 1:
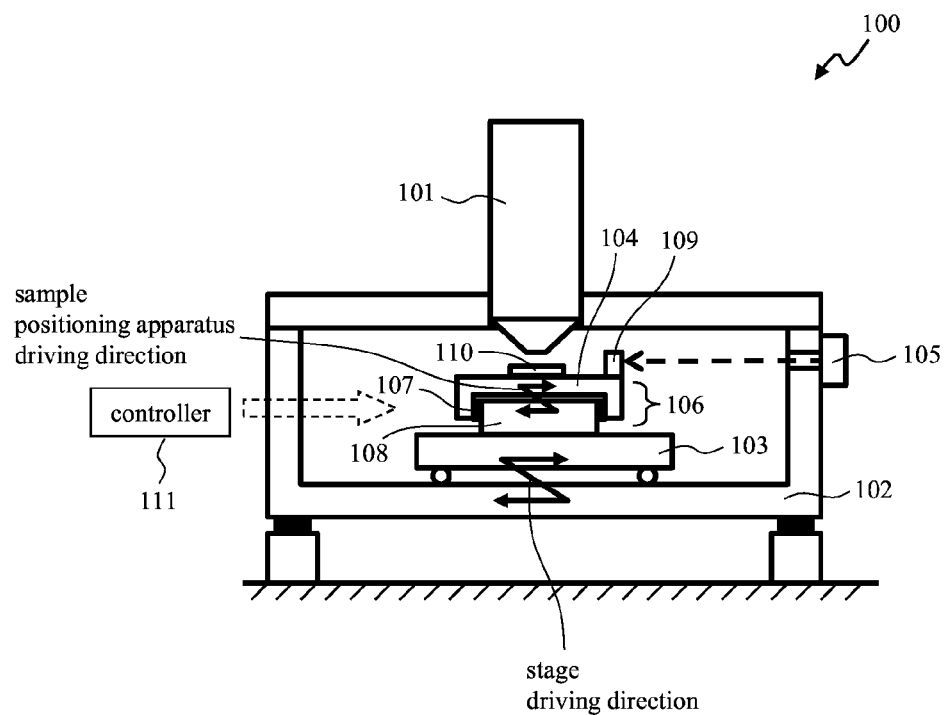
FIG. 1 is a side sectional diagram showing a configuration of a length measurement SEM 100 that equips a sample positioning apparatus 106 according to an embodiment 1 of the present invention.

FIG. 1 is a side sectional diagram showing a configuration of a length measurement SEM 100 that equips a sample positioning apparatus 106 according to an embodiment 1 of the present invention. Firstly the overall configuration of the length measurement SEM 100 will be described using FIG. 1. Then detailed configurations of the sample positioning apparatus 106 will be described using FIG. 2 and figures thereafter.

Within a vacuum chamber 102, a stage 103 is placed by which a sample 110 such as wafer to be observed is positioned. The stage 103 is driven by a linear motor that provides propulsive force.

The sample positioning apparatus 106 is placed on the stage 103. The sample positioning apparatus 106 is driven in the same direction as the stage 103 by a piezoelectric actuator 107. A controller 107 is a computational device such as microcontroller. The controller 107 drives the piezoelectric actuator 107 and controls overall operation of the length measurement SEM 100.

A top table 104 on which the sample 110 is placed is disposed on the sample positioning apparatus 106. The sample positioning apparatus 106 and the top table 104 are placed on an intermediate table 108.

A laser interferometer 105 is a position meter that measures positions of the sample 110 by measuring positions of the top table 104 and that notifies the measurement result to the controller 111. The controller 111 performs feedback control calculations according to the measurement result, and creates a position control command for the top table 104 so that the observed point of the sample 110 will be directly below a column 101, thereby positioning the stage 103 so that the difference between the specified position and the measured result will be within tens of nanometers.

The column 101 irradiates electron beams onto the sample 110 on the top table 104. The controller 111 acquires observed images of the sample 111 based on secondary electrons generated from the sample 111 to acquire information such as line width of circuit patterns on the sample 110.

Since the stage 103 is always driven by the linear motor, nanometer-scale vibrations are continuously generated, and the nanometer-scale vibration affects positioning precision of the top table 104. Thus the sample positioning apparatus 106 actively removes residual vibrations generated by the linear motor when the linear motor drives the stage 103.

The stage 103 and the sample positioning apparatus 106 have common characteristics in that they both are positioning mechanisms that position the sample 110 within the vacuum chamber 102. However, their characteristics are different from each other in that the stage 103 positions the sample 110 within a movable stroke of hundreds of millimeters while the sample positioning apparatus 106 rapidly positions the sample 110 within a micro movable stroke of tens of nanometers. The difference between those characteristics will be described later.

Figure 2:
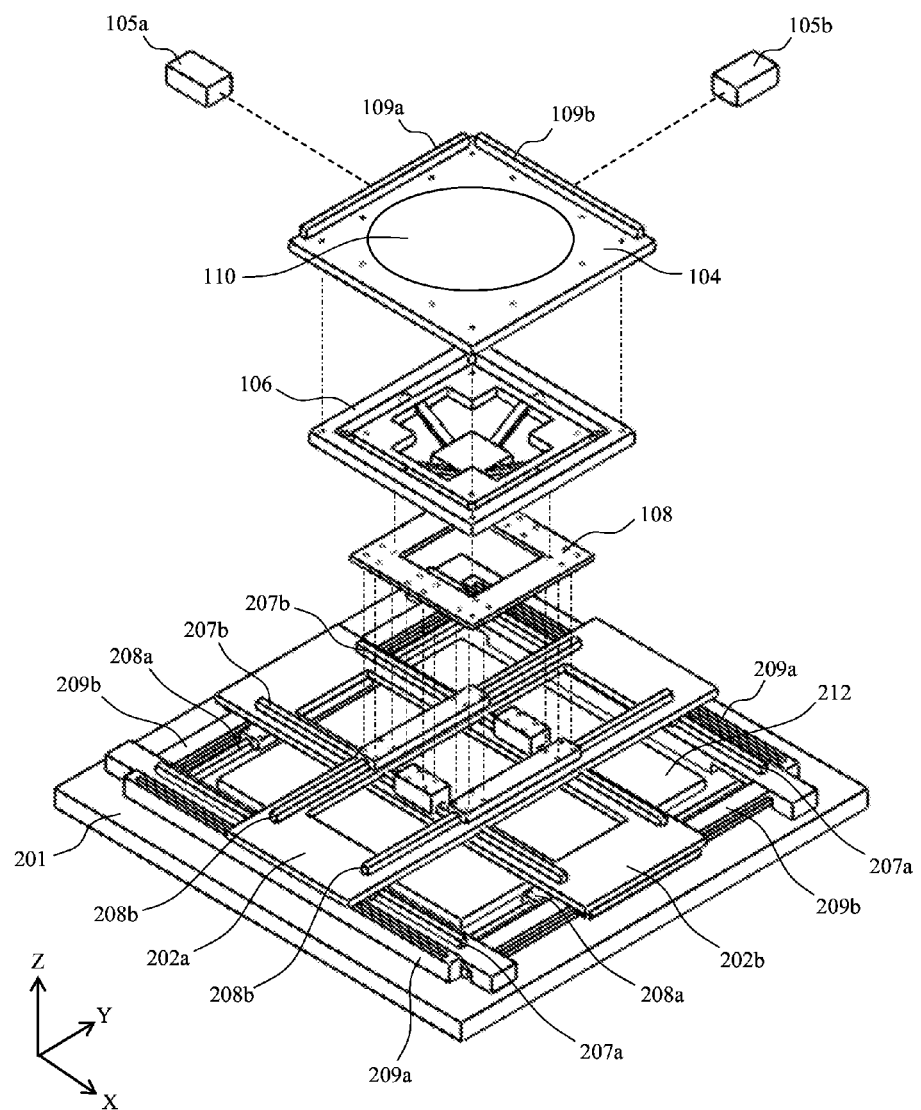
FIG. 2 is a diagram showing a configuration of a stage 103 that equips the sample positioning apparatus 106.

FIG. 2 is a diagram showing a configuration of the stage 103 that equips the sample positioning apparatus 106. Hereinafter, the configuration of the stage 103 will be described with reference to FIG. 2.

A X-axis linear guide 207a that guides in the X-axis direction and a Y-axis linear guide 208a that guides in the Y-axis direction are fixed on a base 201. A X-axis intermediate slider 202a that moves in the X-axis direction is fixed on the X-axis linear guide 207a. A Y-axis intermediate slider 202b that moves in the Y-axis direction is fixed on the Y-axis linear guide 208a.

The X-axis intermediate slider 202a is driven in the X-axis direction by two X-axis linear motors 209a that generate propulsive force in the X-axis direction. The Y-axis intermediate slider 202b is driven in the Y-axis direction by two Y-axis linear motors 209b that generate propulsive force in the Y-axis direction.

A X-axis linear guide 207b that guides in the X-axis direction is fixed on the Y-axis intermediate slider 202b. The intermediate table 108 is supported by the X-axis linear guide 207b, and thus the intermediate table 108 may be moved in the X-axis direction. The two X-axis linear motors 209a generating propulsive force in the X-axis direction provide propulsive force in the X-axis direction. The propulsive force in the X-axis direction is transmitted to the intermediate table 108 through the X-axis intermediate slider 202a and through a Y-axis linear guide 208b on the X-axis intermediate slider 202a.

With the configuration above, the intermediate table 108 is guided and driven in the X-axis and Y-axis directions, thereby moving the intermediate table 108 toward any position in the horizontal plane.

A brake plate 212 is fixed on the base 201. By activating an active brake (details will be described later) of the sample positioning apparatus 106, a brake pad 304 (described in FIG. 3 later) of the active brake is pushed downward to be pressed toward the brake plate 212, thereby acquiring brake force in the horizontal direction.

The intermediate table 104, the X-axis intermediate slider 201a, and the Y-axis intermediate slider 202b have a frame-type structure which center includes a hole through which the brake pad 304 passes, so that those components do not interfere with movement of the brake pad 304.

The sample positioning apparatus 106 is fixed on the intermediate table 108. The top table 104 is fixed on the sample positioning apparatus 106. The top table 104 is provided with a X-axis planar mirror 109a that reflects laser light in the X-axis direction irradiated by a X-axis laser interferometer 105a and with a Y-axis planar mirror 109b that reflects laser light in the Y-axis direction irradiated by a Y-axis laser interferometer 105b.

Figure 3:
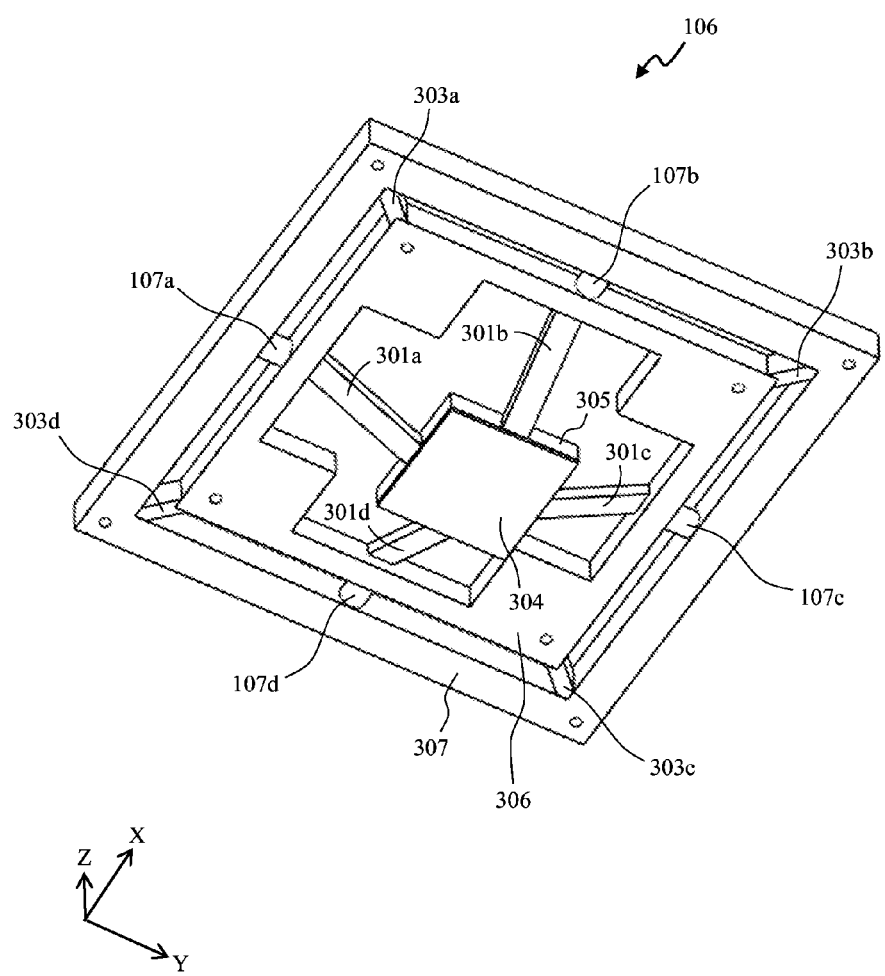
FIG. 3 is a perspective diagram acquired by seeing the sample positioning apparatus 106 from obliquely below it.

FIG. 3 is a perspective diagram acquired by seeing the sample positioning apparatus 106 from obliquely below it. Hereinafter, detailed configurations of the sample positioning apparatus 106 will be described with reference to FIG. 3.

The brake pad 304 is a member for acquiring brake force in the XY plane by pressing it toward the brake plate 212. The brake pad 304 is fixed to a brake pad fixing portion 305 at the central position. Four beam members, namely brake connection rods 301a, 301b, 301c, and 301d are connected to the brake pad fixing portion 305.

Four piezoelectric actuators 107a, 107b, 107c, and 107d are disposed outside of each of the brake connection rods 301a-301d, respectively. An inner frame 306 is disposed between the piezoelectric actuators 107a-107d and the brake connection rods 301a-301d.

By applying voltages having same polarity to all of the piezoelectric actuators 107a-107d to expand and shrink them, the inner frame 306 deforms and the brake connection rods 301a-301d are displaced toward the center of the inner frame 306. Accordingly, the brake pad fixing portion 305 is pushed downward, the brake pad 304 contacts with the brake plate 212, and braking force is acquired in the XY plane. In other words, the brake connection rods 301a-301d, the piezoelectric actuators 107a-107d, the brake pad 304, and the brake pad fixing portion 305 cooperate together so that they provide functionality as an active brake.

An outer frame 307 is disposed outside of the piezoelectric actuators 107a-107d. The top plate 104 is fixed on the outer frame 307. Four corners of the inner frame 306 and four corners of the outer frame 307 are connected with each other by elastic supports 303a, 303b, 303c, and 303d. The elastic supports 303a-303d support the inner frame 306 or the outer frame 307 so that the frames are not inclined with respect to the XY plane when the piezoelectric actuators 107a-107d work.

Figure 4:
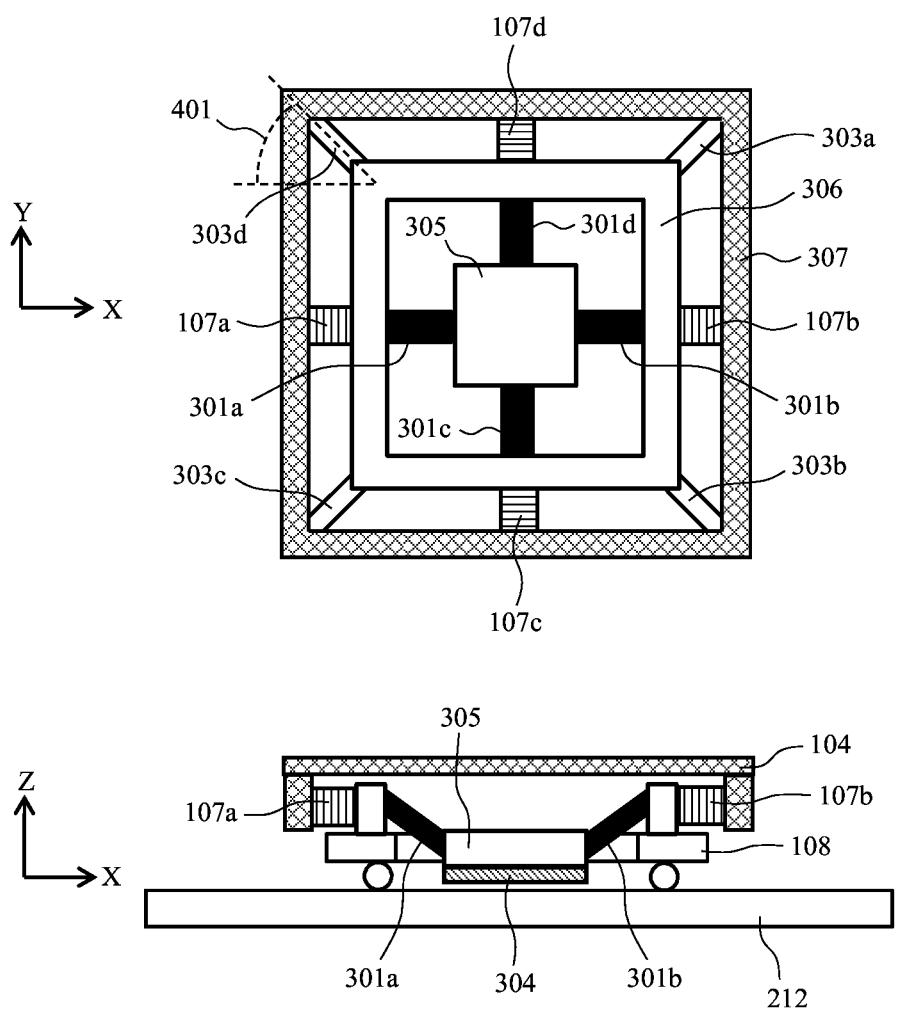
FIG. 4 is a diagram showing a top view and a side view of the sample positioning apparatus 106.

FIG. 4 is a diagram showing a top view and a side view of the sample positioning apparatus 106. Hereinafter, operation of the sample positioning apparatus 106 will be outlined with reference to FIG. 4.

The sample positioning apparatus 106 mainly comprises an elastic deformation frame and the piezoelectric actuators 107a-107d. The elastic deformation frame comprises the inner frame 306, the outer frame 307 surrounding the inner frame 306, and the four elastic supports 303a-303d connecting the outer corners of the inner frame 306 to the inner corners of the outer frame 307.

The inner frame 306 is fixed on the intermediate table 108. The top table 104 is fixed on the outer frame 307. The four piezoelectric actuators 303a-303d bridge the inner frame 306 and the outer frame 307.

When all of the piezoelectric actuators 107a-107d are extended, the brake connection rods 301a-301d push the brake pad fixing portion 305 downward, so that the brake pad 304 is pressed toward the brake plate 212. This operation acquires braking force so that the inner frame 306 does not move with respect to the brake plate 212.

By providing the outer frame 307 with a force using a combination of the opposing piezoelectric actuators 107a and 107b or a combination of the piezoelectric actuators 107c and 107d, the elastic supports 303a-303d may be deformed so that the outer frame 307 is displaced with respect to the inner frame 306. For example, by pressing the brake pad 304 toward the brake plate 212, extending the piezoelectric actuator 107a, and shrinking the piezoelectric actuator 107b, the brake pad fixing portion 305 may be displaced in the X-axis negative direction of FIG. 4.

When positioning the sample 110, the stage 103 is moved to a desired position, the piezoelectric actuators 107a-107d are driven to activate the active brake, and the position of the top table 104 is adjusted with respect to the stage 103 within hundreds of nanometer order. Then the opposing piezoelectric actuators operate in the opposite directions from each other to micro-adjust the position of the top table 104 within tens of nanometer order.

When micro-adjusting the position of the top table 104, since the brake pad 304 is pressed toward the brake plate 212 to contact with it, the inner frame 306 is not deformed almost at all even if the piezoelectric actuators work. Thus only the outer frame 307 may be displaced. In addition, the operational amount of the piezoelectric actuators when the outer frame 307 is displaced is very small comparing with the operational amount when pressing the brake pad 304. In other words, the deformation of the inner frame 306 when micro-adjusting the position of the top table 104 does not have effect on positioning precision of the top table 104 almost at all.

In addition, in the elastic deformation frame in the embodiment 1, the elastic support angle 401 of the elastic supports 303a-303d with respect to the X-axis direction is 45 degree. Thus the elastic supports 303a-303d are formed obliquely toward the inner frame 306 and the outer frame 307. With such configuration, a single elastic support can guide the inner frame 306 and the outer frame 307 in the X and Y directions. Therefore, no guide mechanism is required for each of the X and Y directions.

In the elastic deformation frame shown in FIG. 4, the inner frame 306 and the outer frame 307 have square shapes, and the elastic support angle 401 of the elastic supports 303a-303d is 45 degree, i.e. the elastic support angle 401 is set at the diagonal direction of the inner frame 306 and the outer frame 307. However, they are not limited to such configurations. For example, even if the elastic support angle 401 is an angle other than 45 degree, they work as elastic supports as long as the outer frame 307 may be displaced in the both of X and Y directions. Further, by changing designed values of the elastic support angle 401, the displacement amount of the outer frame 307 in the X and Y directions can be adjusted.

Figure 5:
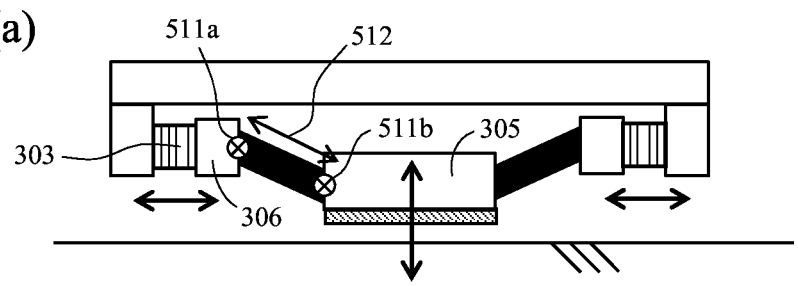
FIG. 5 is a diagram showing shape examples of the sample positioning apparatus 106 in which angles of brake connection rods 301a-301d are variously changed.
Figure 5:
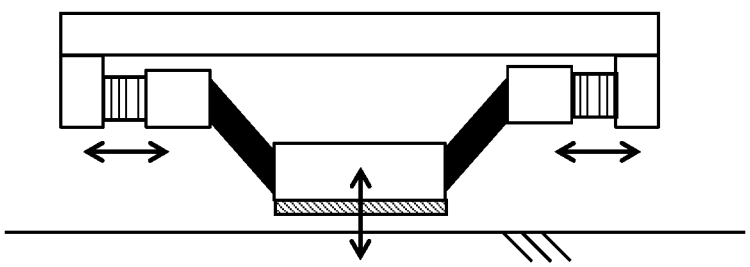
Figure 5:
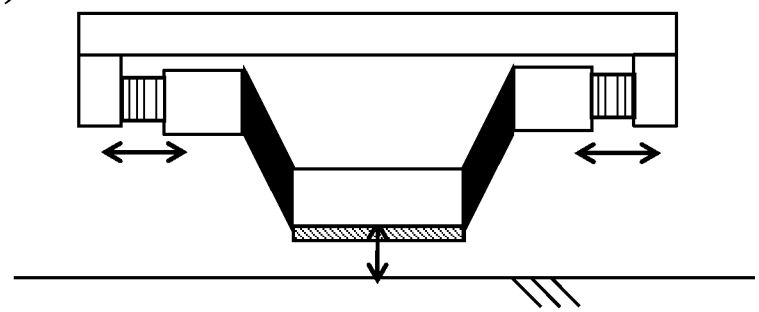

FIG. 5 is a diagram showing shape examples of the sample positioning apparatus 106 in which angles of the brake connection rods 301a-301d are variously changed. As shown in FIG. 5 (a) (b) (c), by changing the angle in the oblique direction of the brake connection rod 301 that connects the brake pad fixing portion 305 and the inner frame 306, the movement amount in the vertical direction of the rod hinge portion 511b can be changed with respect to the displacement of the rod hinge portion 511a in the horizontal direction. Note that the brake connection rod length 512 is a fixed value L.

Figure 6:
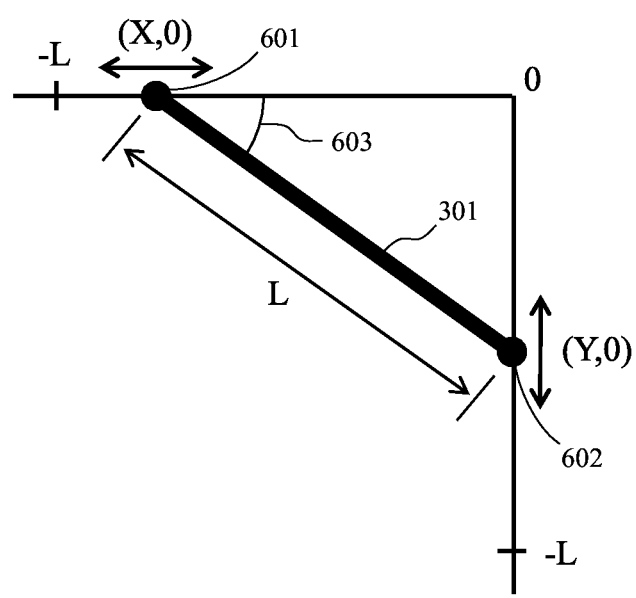
FIG. 6 is a diagram showing a relationship between an inclination of the brake connection rod 301 and a position of a rod hinge portion.

FIG. 6 is a diagram showing a relationship between an inclination of the brake connection rod 301 and a position of the rod hinge portion. The rod hinge coordinate 601 corresponds to the rod hinge portion 511a in FIG. 5. The rod hinge coordinate 602 corresponds to the rod hinge portion 511b in FIG. 5.

Now it is assumed that the rod hinge portion 511a is displaced only in the horizontal direction and that the rod hinge portion 511b is displaced only in the vertical direction. In other words, the Y-coordinate of the rod hinge coordinate 601 is 0, and the X-coordinate of the rod hinge coordinate 602 is 0. Since the length of the brake connection rod 301 is fixed, the distance between the rod hinge coordinate 601 and the rod hinge coordinate 602 is a fixed value L. A rod angle 603 is the angle formed by the brake connection rod 301 with respect to the XY plane.

Figure 7:
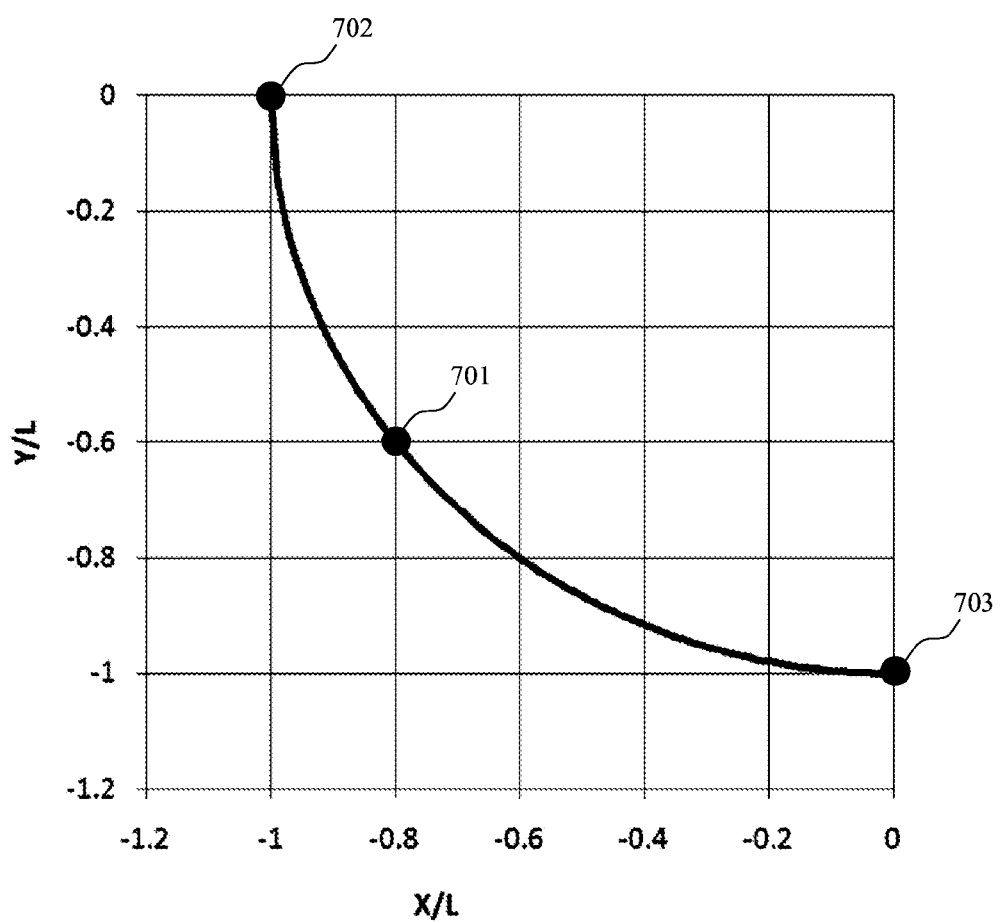
FIG. 7 is a graph showing a relationship between X/L and Y/L assuming that an coordinate of the rod hinge portion 601 is (X, 0) and an coordinate of the rod hinge portion 602 is (0, Y).

FIG. 7 is a graph showing a relationship between X/L and Y/L assuming that the rod hinge coordinate 601 is (X, 0) and the rod hinge coordinate 602 is (0, Y), and that the hinge coordinates are changed within the range of $-L<X<0$ and $-L<Y<0$.

The point 702 corresponds to the case when X/L=0, i.e. the brake connection rod 301 is at horizontal position. The change in Y-coordinate with respect to the change in X-coordinate is maximum at this point. In other words, by placing the brake connection rod 301 at horizontal position, the displacement of the rod hinge portion 511b with respect to the displacement in the horizontal direction of the rod hinge portion 511a in FIG. 5 becomes maximum. Thus the displacement of the brake pad fixing portion 305 with respect to the displacement of the piezoelectric actuator 107 becomes maximum.

The point 703 corresponds to the case when Y/L=0, i.e. the brake connection rod 301 is at vertical position. The displacement of the brake pad fixing portion 305 with respect to the displacement of the piezoelectric actuator 107 is minimum at this point.

Therefore, the displacement amount of the brake pad 304 is maximum when the brake connection rod is close to horizontal position as in FIG. 5 (a), and the displacement amount of the brake pad 304 becomes smaller as the rod angle 603 becomes larger as in FIG. 5 (*b*) or (*c*).

As the brake connection rod 301 becomes more horizontal, it becomes more likely that the rod hinge portion 511*b* will be displaced upward rather than downward, thus stable braking force cannot be acquired. In addition, if the impact power that is caused when the brake pad 304 contacts with the brake plate 212 arises a problem, it is advantageous to suppress the displacement of the brake pad 304 by adjusting the rod angle 603. Using this relationship, the angle of the brake connection rod 301 may be designed according to the required displacement amount of the brake pad 304.

Figure 8:
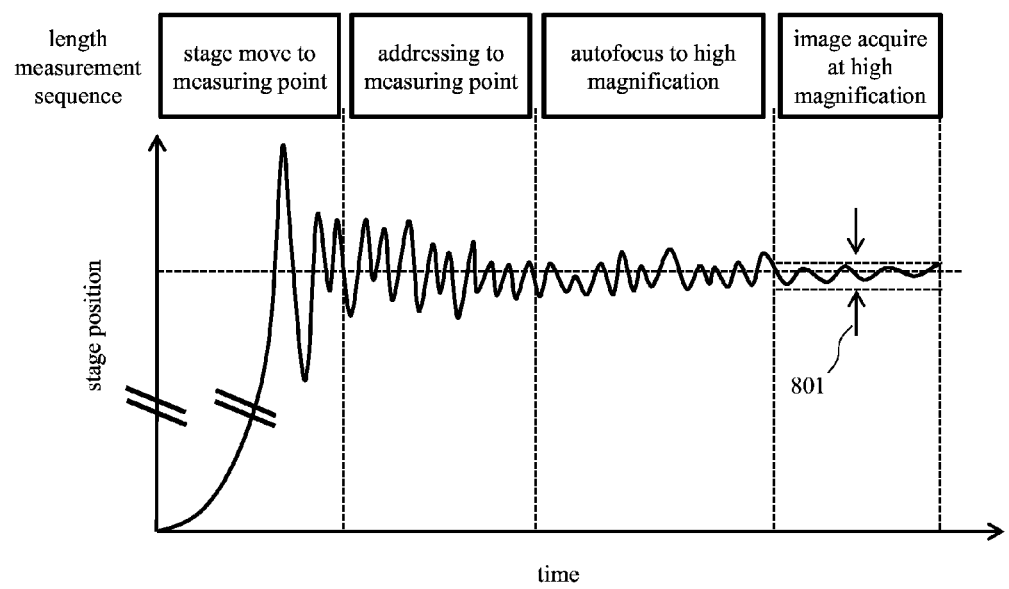
FIG. 8 is a graph showing a relationship between a length measurement sequence and a vibration of a top table 104.

FIG. 8 is a graph showing a relationship between a length measurement sequence and a vibration of the top table 104. In the length measurement sequence, the stage is moved to the length measuring point within tens of nanometer order, addressing to the measuring point and autofocus to high magnification are performed, and then image is acquired at high magnification. The sample positioning apparatus 106 is used to suppress a micro residual vibration 801 of nanometer-order when acquiring image at high magnification. In other words, the controller 111 mainly controls the sample positioning apparatus 106 when performing high magnification image acquisition in the length measurement sequence.

Figure 9:
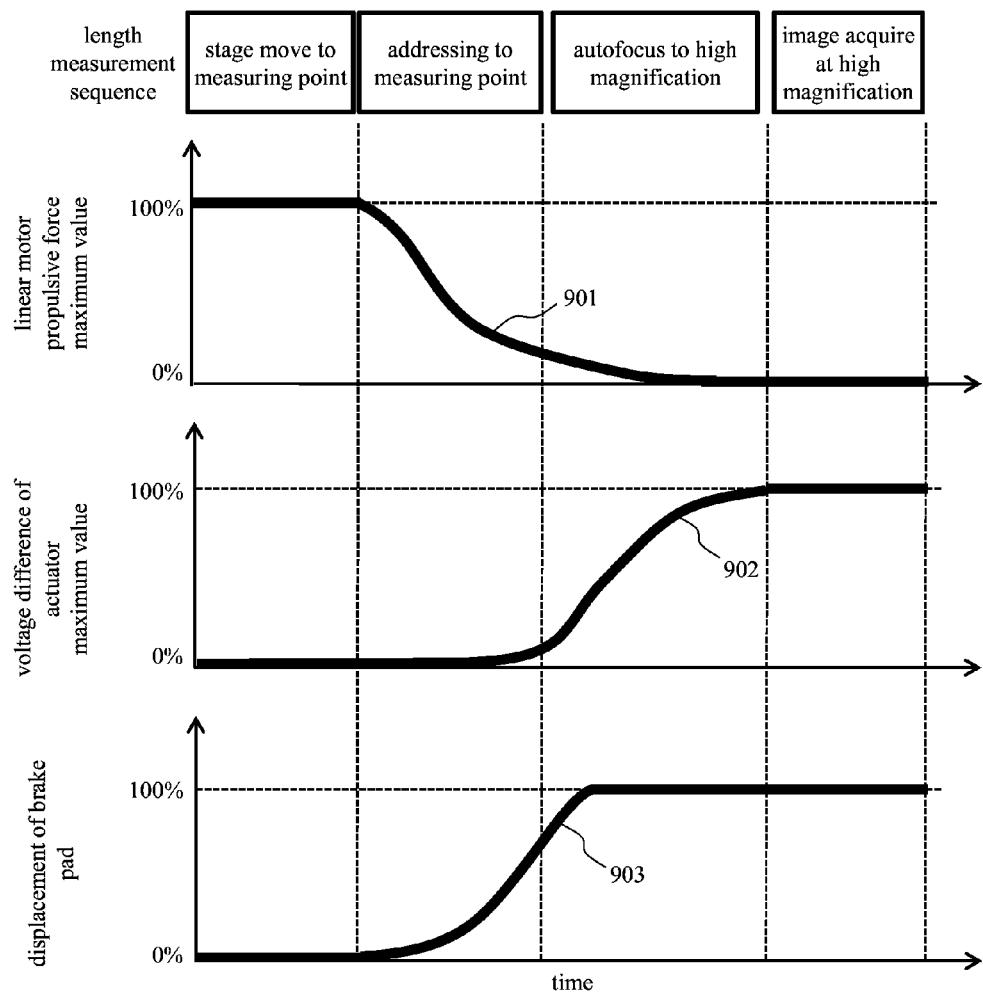
FIG. 9 is a diagram showing output variations of each unit in the length measurement sequence of FIG. 8.

FIG. 9 is a diagram showing output variations of the linear motor, the sample positioning apparatus 106, and the active brake included in the sample positioning apparatus 106 in the length measurement sequence of FIG. 8. Hereinafter, operations of each components in the length measurement sequence will be described with reference to FIG. 9.

When moving the stage 103 to the length measuring point, only the linear motor is used to position the stage 103. In other words, the propulsive force maximum value of the linear motor is not limited and thus is 100%, and the sample positioning apparatus 106 and the active brake are not used.

When performing addressing to the measuring point and autofocus to high magnification, the propulsive force maximum value is limited so as to decrease the linear motor propulsive force. At the same time, voltages applied to all of the piezoelectric actuators 107*a*-107*d* are gradually increased so that the active brake gradually works. This operation gradually increases the displacement of the brake pad 304. The displacement reaches the maximum when the brake pad 304 contacts with the brake plate 212.

After the displacement of the brake pad 304 reaches the maximum, the maximum value of the difference between voltages applied to the opposing piezoelectric actuators 107 will be gradually increased. This operation gradually increases the maximum width by which the outer frame 307 may be displaced.

As discussed thus far, the controller 111 continuously transit from a state in which the linear motor is rapidly moving the stage 103 into a state in which the sample positioning apparatus 106 actively removes vibrations. Thus impulse-like vibrations due to stepwise steep output changes are suppressed.

Figure 10:
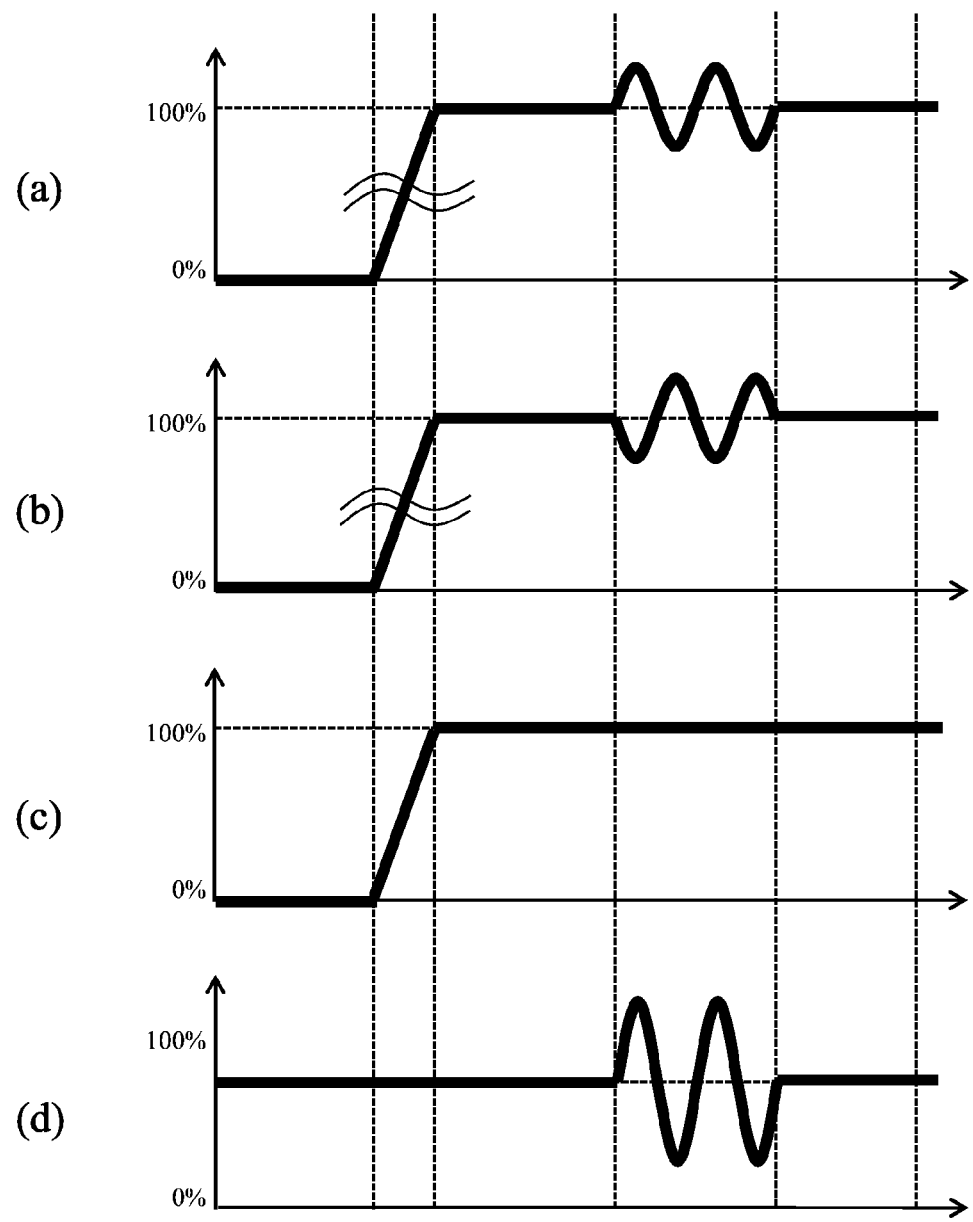
FIG. 10 is a diagram showing a relationship between a voltage applied to a piezoelectric actuator 107 and a displacement of the sample positioning apparatus 106.

FIG. 10 is a diagram showing a relationship between a voltage applied to the piezoelectric actuator 107 and a displacement of the sample positioning apparatus 106. FIG. 10 (*a*) (*b*) shows the change in voltages applied to the opposing piezoelectric actuators 107*a* and 107*b*. FIG. 10 (*c*) shows the displacement of the brake pad 304. FIG. 10 (*d*) shows the displacement of the outer frame 307 after the brake pad 304 contacts with the brake plate 212.

As shown in FIG. 10 (*a*)-(*c*), when activating the active brake, the controller 111 applies positive voltages to the piezoelectric actuators 107*a* and 107*b*. The sum of these applied voltages corresponds to the displacement of the brake pad 304. After the active brake is activated and the displacement of the brake pad 304 becomes maximum, the applied voltage at that time will be kept.

After the active brake is activated, when micro-adjusting the position of the top table 104 by micro-displacing the outer frame 307, the controller 111 applies opposite voltages to the piezoelectric actuators 107*a* and 107*b* respectively. The difference between the applied voltages operates the piezoelectric actuators 107*a* and 107*b* in opposite directions from each other, and the outer frame 307 is micro-displaced to micro-adjust the position of the top table 104. The micro-displacement at this time is in the direction canceling the vibration of the top table 104.

As discussed thus far, the controller 111 controls the braking force of the active brake and the position of the top table 104 using sum and difference of the voltages applied to the piezoelectric actuators 107*a* and 107*b*, respectively. Thus operational controls even for the same piezoelectric actuator 107 achieve controlling each of them independently.

The opposite voltages applied to the piezoelectric actuators 107*a* and 107*b* for micro-adjusting the position of the top table 104 is merely about one-hundredth of the voltages with same polarity applied for activating the active brake. Thus in terms of magnitude of the voltage applied to the piezoelectric actuator 107, the operational control for the active brake does not interfere with the positional control for the top table 104. Therefore, in terms of these two controls, the controller 111 can independently control the brake force of the active brake and the position of the top table 104.

In general, by applying negative voltages to piezoelectric actuators, the piezoelectric actuators may be broken. In FIG. 10, voltages with opposite polarities are applied to the piezoelectric actuators 107*a* and 107*b* for micro-adjusting the position of the top table 104. Thus negative voltage may be applied to any one of the piezoelectric actuators. Accordingly, a bias voltage such as 10V is added to the voltage applied to the piezoelectric actuators, and then the piezoelectric actuators are used within the range of ±10V around 10V, thereby preventing damages in general cases.

In the embodiment 1, however, the position of the top table 104 is micro-adjusted after activating the active brake. Thus the voltages applied to the piezoelectric actuators are about 100 times larger than the voltages with opposite polarities at that time. Therefore, there is no practical possibility that negative voltages are applied to the piezoelectric actuators. In other words, in the embodiment 1, activating the active brake itself also provides the bias voltage to the piezoelectric actuators. This is advantageous in that the control operations can be simplified.

Embodiment 1

Summary

As discussed thus far, the sample positioning apparatus 106 according to the embodiment 1 is placed on the stage 103, and the brake pad 304 is pressed toward the brake plate 212 on the stage 103 to stop the top table 104 and to displace the outer frame 307, thereby actively remove vibrations of the top table 104. Accordingly, without stopping output of the linear motor, the sample 110 can be precisely positioned.

In addition, when micro-adjusting the position of the top table 104, the sample positioning apparatus 106 according to the embodiment 1 applies, to the piezoelectric actuator 107, a small voltage that is about one-hundredth of the voltage applied in activating the active brake. Accordingly, the inner frame 306 does not move almost at all when micro-adjusting the position of the top table 104. Thus the effect of the displacement of the inner frame 306 on positioning precision can be suppressed.

In addition, the sample positioning apparatus 106 according to the embodiment 1 micro-adjusts the position of the top table 104 after activating the active brake. Accordingly, when applying voltages with opposing polarities to the opposing piezoelectric actuator 107, the applied voltage has a large value. Thus there is no practical possibility that negative voltages are applied to the piezoelectric actuator 107. In other words, it is not necessary to apply a bias voltage to the piezoelectric actuator, thereby simplifying the control operation of the controller 111.

Embodiment 2

In the embodiment 1, the invention made by the inventors is specifically described. However, the present invention is not limited to the form described in the embodiment 1. As long as the spirit of the invention is not departed, various modifications are possible.

For example, the laser interferometer 105 and the controller 111 may be configured as parts of the sample positioning apparatus 106 or those components may be configured as other components and connected to the apparatus by such as wires so that they cooperate together. It applies to other components.

REFERENCE SIGNS LIST

101: column
102: vacuum chamber
103: stage
104: top table
105: laser interferometer
105a: X-axis laser interferometer
105b: Y-axis laser interferometer
106: sample positioning apparatus
107: piezoelectric actuator
107a-107d: piezoelectric actuator
108: intermediate table
109: planar minor
109a: X-axis planar minor
109b: Y-axis planar minor
110: sample
201: base
202a: X-axis intermediate slider
202b: Y-axis intermediate slider
207a: X-axis linear guide
207b: X-axis linear guide
208a: Y-axis linear guide
208b: Y-axis linear guide
209a: X-axis linear motor
209b: Y-axis linear motor
212: brake plate
301a-301d: brake connection rod
303a-303d: elastic support
304: brake pad
305: brake pad fixing portion
306: inner frame
307: outer frame
401: elastic support angle
511a-511b: rod hinge portion
512: brake connection rod length
601-602: rod hinge coordinate
603: rod angle
801: residual vibration magnitude

The invention claimed is:

1. A sample positioning apparatus that positions a sample with respect to a stage, comprising:
   a top table on which the sample is placed;
   an active brake that is disposed under the top table and that generates a reactive force in a direction in which the top table moves with respect to the stage to stop the top table;
   an inner frame that is disposed under the top table and that surrounds the active brake;
   an outer frame that is disposed under the top table and that surrounds the inner frame; and
   an actuator that is disposed between the inner frame and the outer frame and that drives the active brake,
   wherein the active brake is fixed to the inner frame and the top table is fixed to the outer frame,
   and wherein the actuator, after driving the active brake to stop the top table with respect to the stage, presses the outer frame to adjust a position of the top table.

2. The sample positioning apparatus according to claim 1, further comprising a controller that controls an operation of the actuator,
   wherein the controller, when pressing the outer frame to adjust the position of the top table, uses an operational amount of the actuator smaller than that for driving the active brake to stop the top table with respect to the stage.

3. The sample positioning apparatus according to claim 2, wherein multiple of the actuator are disposed around the active brake along the inner frame,
   wherein multiple of the actuator are configure so that, if all of multiple of the actuator work in the same polarity the active brake is activated, and if at least one of multiple of the actuator works in a polarity opposite to that of other ones of the actuator the outer frame is pressed depending on a difference between the polarity,
   wherein the controller, when driving the active brake to stop the top table with respect to the stage, operates all of multiple of the actuator in the same polarity,
   and wherein the controller, when pressing the outer frame to adjust the position of the top table, operates at least one of multiple of the actuator in a polarity opposite to that of other ones of the actuator.

4. The sample positioning apparatus according to claim 3, wherein the actuator is configured using a piezoelectric actuator that is broken by applying a negative voltage,
   wherein the controller, when pressing the outer frame to adjust the position of the top table, applies a voltage with negative polarity based on a predetermined bias voltage as a reference voltage to at least one of multiple of the actuator, and applies a voltage with positive polarity based on the bias voltage as a reference voltage to other ones of the actuator,
   and wherein the controller, when driving the active brake to stop the top table with respect to the stage, applies a positive voltage as the bias voltage that is large enough so that a negative voltage is not applied to the actuator even if a voltage with negative polarity is applied to the actuator in pressing the outer frame to adjust the position of the top table.

5. The sample positioning apparatus according to claim 2, further comprising a position meter that measures the position of the top table,
   wherein the controller feedback-controls a voltage applied to the actuator according to the position of the top table measured by the position meter.

6. The sample positioning apparatus according to claim 1, wherein the active brake is configured to acquire the reactive force by pressing a brake pad toward the stage,
and wherein the actuator, when driving the active brake to stop the top table with respect to the stage, presses the brake pad toward the stage by pushing the brake pad toward the stage.

7. The sample positioning apparatus according to claim 1, the active brake comprising:
   a brake pad that is configured to acquire the reactive force by being pressed toward the stage; and
   a beam member that mechanically connects the brake pad to the inner frame,
   wherein the actuator, when driving the active brake, pushes the brake pad downward by pushing the beam member, so that the brake pad is pressed toward the stage.

8. The sample positioning apparatus according to claim 1, further comprising an elastic support that connects the inner frame to the outer frame and that has elasticity,
   wherein the elastic support bridges the inner frame and the outer frame to connect these frames in an oblique direction with respect to a direction in which the actuator presses the outer frame.

9. The sample positioning apparatus according to claim 8, wherein the inner frame is configured as a rectangle frame surrounding the active brake and the outer frame is configured as a rectangle frame surrounding the inner frame,
   wherein the elastic support bridges a corner portion of the inner frame and a corner portion of the outer frame,
   wherein the active brake comprises:
   a brake pad that acquires the reactive force by being pressed toward the stage; and
   a beam member that bridges the brake pad and each side of the inner frame,
   wherein the actuator is disposed between each side of the inner frame and each side of the outer frame respectively,
   and wherein the actuator, when driving the active brake, pushes the brake pad downward by pushing the beam member, thereby pressing the brake pad toward the stage.

10. A sample stage that comprises the sample positioning apparatus according to claim 1.

11. A charged particle beam apparatus that comprises the sample stage according to claim 10.

* * * * *